US009601184B2

United States Patent
Lee

(10) Patent No.: US 9,601,184 B2
(45) Date of Patent: Mar. 21, 2017

(54) SEMICONDUCTOR MEMORY AND METHOD FOR OPERATING THE SAME

(71) Applicant: SK hynix Inc., Gyeonggi-do (KR)

(72) Inventor: Kyong-Ha Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/000,832

(22) Filed: Jan. 19, 2016

(65) Prior Publication Data

US 2016/0133313 A1    May 12, 2016

Related U.S. Application Data

(62) Division of application No. 14/483,836, filed on Sep. 11, 2014, now Pat. No. 9,269,421.

(30) Foreign Application Priority Data

Apr. 2, 2014    (KR) .................. 10-2014-0039349

(51) Int. Cl.
| | |
|---|---|
| *G11C 7/10* | (2006.01) |
| *G11C 7/08* | (2006.01) |
| *G11C 11/4096* | (2006.01) |
| *G11C 11/4094* | (2006.01) |
| *G11C 11/4076* | (2006.01) |
| *G11C 11/4093* | (2006.01) |
| *G11C 11/418* | (2006.01) |
| *G11C 8/18* | (2006.01) |
| *G11C 11/408* | (2006.01) |

(52) U.S. Cl.
CPC .......... *G11C 11/4096* (2013.01); *G11C 7/109* (2013.01); *G11C 11/4076* (2013.01); *G11C 11/4093* (2013.01); *G11C 11/4094* (2013.01); *G11C 7/08* (2013.01); *G11C 7/1063* (2013.01); *G11C 8/18* (2013.01); *G11C 11/4087* (2013.01); *G11C 11/418* (2013.01)

(58) Field of Classification Search
CPC .......... G11C 7/109; G11C 7/1063; G11C 7/08
USPC .............................. 365/189.05, 191
See application file for complete search history.

(56) References Cited

U.S. PATENT DOCUMENTS

| | | | | |
|---|---|---|---|---|
| 2006/0104150 | A1* | 5/2006 | Yoshida ............... | G11C 7/1051 365/230.01 |
| 2007/0180202 | A1* | 8/2007 | Kawabata .......... | G06F 13/1694 711/154 |
| 2010/0177589 | A1* | 7/2010 | Kinoshita ........... | G11C 7/1027 365/233.11 |
| 2012/0195148 | A1* | 8/2012 | Yoko ....................... | G11C 5/04 365/219 |

* cited by examiner

*Primary Examiner* — Ly D Pham
(74) *Attorney, Agent, or Firm* — IP & T Group LLP

(57) ABSTRACT

A semiconductor memory may include: a storage unit suitable for storing a minimum operation interval between row command operations, a detection unit suitable for detecting whether row command signals inputted for the row command operations are activated at the minimum operation interval, a latching unit suitable for generating flag signals by latching the row command signals, and a shifting unit suitable for shifting the flag signals based on the minimum operation interval in response to an output signal of the detection unit, and generating an internal row command signals.

9 Claims, 6 Drawing Sheets

SEMICONDUCTOR MEMORY AND METHOD FOR OPERATING THE SAME

CROSS-REFERENCE TO RELATED APPLICATIONS

This application is a division of U.S. patent application Ser. No. 14/483,836 filed on Sep. 11, 2014, which claims priority of Korean Patent Application No. 10-2014-0039349, filed on Apr. 2, 2014. The disclosure of each of the foregoing applications is incorporated herein by reference in its entirety.

BACKGROUND

1. Field

Exemplary embodiments of the present invention relate to a semiconductor design technology, and more particularly, to a semiconductor memory which receives a command and performs an internal operation.

2. Description of the Related Art

In general, when a command is inputted to a dynamic random access memory (DRAM) from a system chipset for controlling an operation of the DRAM, the DRAM and the system chipset may collide over command input timing due to asynchronous parameter values. For example, a command may not be inputted during its intended clock cycle, but may unintentionally be inputted during the next clock cycle.

In another example, when an interval between active commands inputted successively, that is, RAS (row address strobe) to RAS delay (hereafter, referred to as tRRD) is set as 2tCK and the interval between the active command and a corresponding column command (such as read and write commands), that is, a RAS to CAS (column address strobe) delay (hereafter, referred to as tRCD), is set as 4tCK, the column command and the read command may be inputted at the same time as the active command. In this case, however, since only one command may be inputted per clock cycle, the read command or the active command may be inputted at the to next clock cycle resulting in internal operation being performed behind the proper timing.

SUMMARY

Various embodiments are directed to a semiconductor memory capable of properly performing an internal operation even though commands are inputted at intervals shorter than the proper internal operation intervals.

In an embodiment a semiconductor memory may include: a storage unit suitable for storing a minimum operation interval between row command operations, a detection unit suitable for detecting whether row command signals inputted for the row command operations are activated at the minimum operation interval, a latching unit suitable for generating flag signals by latching the row command signals, and a shifting unit suitable for shifting the flag signals based on the minimum operation interval in response to an output signal of the detection unit, and generating internal row command signals.

In an embodiment, a semiconductor memory may include: a storage unit suitable for storing a minimum operation interval between a row command operation and a column command operation corresponding to the row command operation, a detection unit suitable for detecting whether a row command signal inputted for the row command operation and a column command signal inputted for the column command operation are activated at the minimum operation interval, a latching unit suitable for generating flag signals by latching the row command signal and the column command signal, and a shifting unit suitable for shifting the flag signals based on the minimum operation interval in response to an output signal of the detection unit, and generating internal command signals.

In an embodiment, a method for operating a semiconductor memory may include: receiving a first command signal and generating a first internal command signal for performing an internal operation corresponding to the first command signal, comparing an interval, between activations of the first command signal and a second command signal to a predetermined activation interval, and shifting the second command signal based on the predetermined activation interval in response to a result of the comparing, and generating a second internal command signal for performing an internal operation corresponding to the second command signal.

The predetermined activation interval may be defined as an interval between activations of the first and second internal command signals.

In an embodiment, a memory system may include: a semiconductor memory including a plurality of latching units for receiving and latching a command, and suitable for outputting number information on the latching units, and a controller suitable for adjusting the number of commands inputted to the semiconductor memory during a predetermined command input interval, in response to the number information on the latching units, which is inputted from the semiconductor memory.

In an embodiment, a method for operating a semiconductor memory may include comparing an input interval between first and second command signals to a predetermined input interval, generating first and second internal command signals for first and second operations corresponding to the first and second command signals, respectively, by sifting the first and second command signals based on a result of the comparing, wherein the predetermined input interval is defined as a minimum interval between the first and second operations.

DETAILED DESCRIPTION

Figure 1:
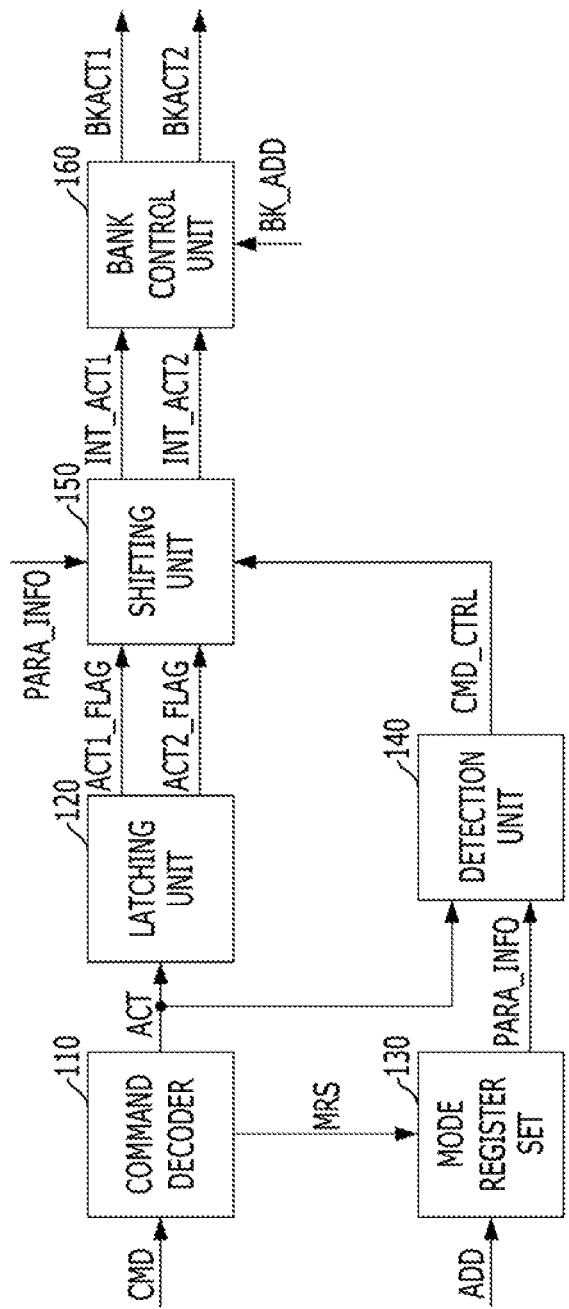
FIG. 1 is a block diagram illustrating a semiconductor memory in accordance with an embodiment of the present invention.

Various embodiments will be described below in more detail with reference to the accompanying drawings. The present invention may however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram illustrating a semiconductor memory in accordance with an embodiment of the present invention.

Referring to FIG. 1, the semiconductor memory includes a command decoder 110, a latching unit 120, a mode register set 130, a detection unit 140, a shifting unit 150, and a bank control unit 160.

In FIG. 1, an active command operation corresponding to a row command operation will be described as an example.

The command decoder 110 may decode a command CMD inputted from outside, and generate an active command ACT and a to mode register set command MRS. The command CMD may include /CS, /RAS, /CAS, /WE and the like, and be received from an external controller.

The latching unit 120 may latch the active command ACT generated through the command decoder 110 and generate flag signals ACT1_FLAG and ACT2_FLAG. When active commands ACT are successively inputted, the latching unit 120 may sequentially generate the flag signals ACT1_FLAG and ACT2_FLAG in response to the active commands ACT which are successively inputted. FIG. 1 illustrates an example in which the active command CMD is inputted two times in a row. Thus, the two flag signals ACT1_FLAG and ACT2_FLAG are generated. When the active command ACT is inputted, three or more times, the number of generated flag signals may increase.

The mode register set 130 may decode an address ADD inputted from outside in response to the mode register set command MRS generated through the command decoder 110, and store a minimum operation interval between an active operation and the next active operation. In other words the mode register set 120 may store asynchronous parameter information PARA_INFO including a RAS to RAS delay tRRD, which indicates an interval between active commands inputted successively, or a RAS to CAS delay tRCD, which indicates an interval between an active command and a corresponding column command such as read and write commands.

The mode register set 130 is an example of a storage unit for storing the asynchronous parameter information PARA_INFO, and another type of storage unit may be used instead of the mode register set 130.

The detection unit 140 may compare the input time of the active command ACT is inputted to tRRD and generate a control signal CMD_CTRL for shifting the flag signals ACT1_FLAG and ACT2_FLAG. The information on the VS to RAS delay tRRD may be included in the asynchronous parameter information PARA_INFO received from the mode register set 130.

The shifting unit 150 may generate internal active commands INT_ACT1 and INT_ACT2 by shifting the flag signals ACT1_FLAG and ACT2_FLAG based on the asynchronous parameter information PARA_INFO, in response to the control signal CMD_CTRL outputted from the detection unit 140. Thus, the internal active commands INT_ACT1 and INT_ACT2 may be generated based on the RAS to RAS delay tRRD.

The bank control unit 160 may generate bank control signals BKACT1 and BKACT2 for sequentially controlling the activation of banks in response to a bank address BK_ADD and the internal active commands INT_ACT1 and INT_ACT2 generated through the shifting unit 150. The internal active commands INT_ACT1 and INT_ACT2 are generated based on the RAS to RAS delay tRRD, and the bank control signals BKACT1 and BKACT2 may be activated in response to the internal active commands INT_ACT1 and INT_ACT2. Thus, since the bank control signals BKACT1 and BKACT2 are also activated based on the RAS to RAS delay tRRD, bank activation controlled in response to the bank control signals BKACT1 and BKACT2 may also be controlled based on the RAS to RAS delay tRRD.

When the active command ACT is inputted regardless of the RAS to RAS delay tRRD, the semiconductor memory in accordance with the embodiment of the present invention may generate the internal active commands INT_ACT1 and INT_ACT2 by considering the RAS to RAS delay through the internal operation and control bank activation at proper timing.

Figure 2:
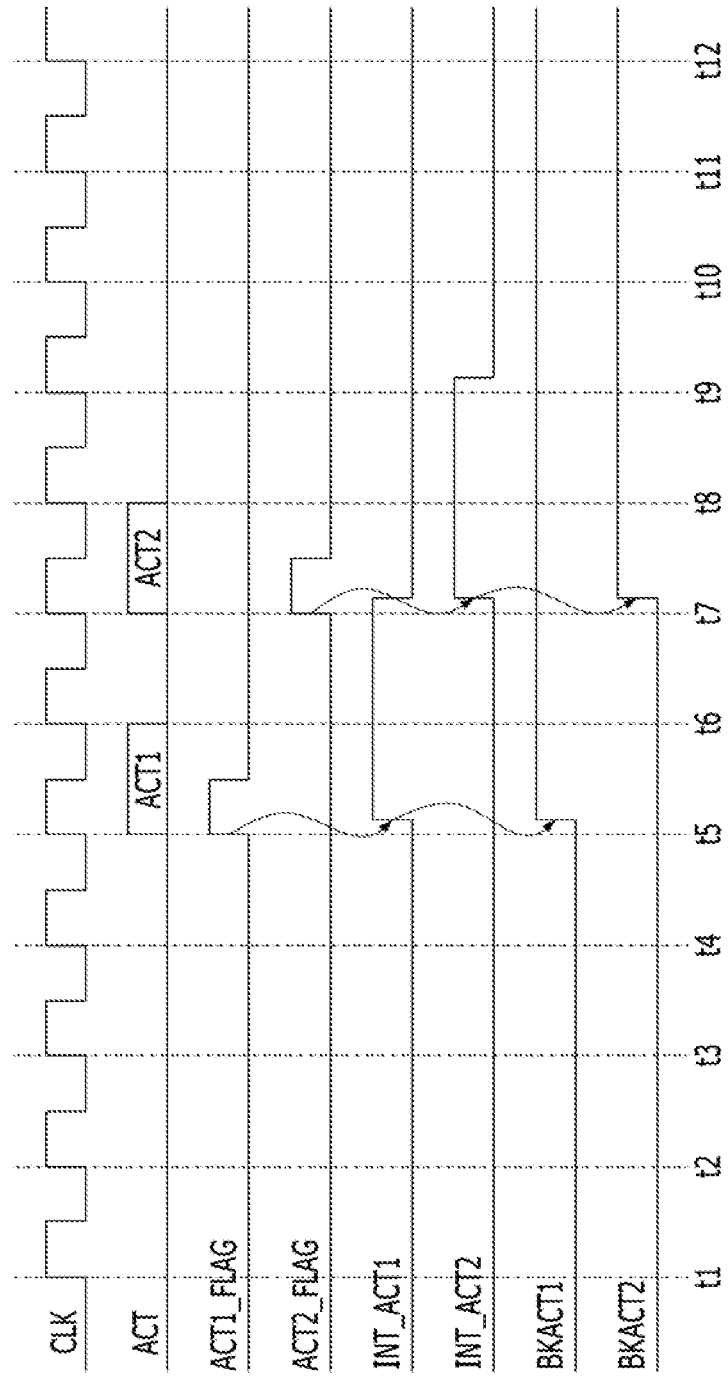
FIG. 2 is a timing diagram illustrating a case in which an active command of FIG. 1 is inputted based on a RAS to RAS delay tRRD.

FIG. 2 is a timing diagram illustrating a case in which the active command of FIG. 1 is inputted based on the RAS to RAS delay tRRD.

Although not illustrated in FIG. 1, the command decoder 110 may decode a command CMD in synchronization with a dock signal CLK.

Referring to FIGS. 1 and 2, first and second active commands ACT1 and ACT2 generated in synchronization with the clock signal CLK may be sequentially inputted from the command decoder 110 at timings t5 and t7 Thus, the first and second flag signals ACT1_FLAG and ACT1_FLAG may be activated by the latching unit 120.

FIG. 2 illustrates a case in which the RAS to RAS delay tRRD is set to 2tCK (tRRD=2tCK). Thus, the second active command ACT2 is inputted in 2tCK from the input of the first active command ACT1. Thus, the flag signals ACT1_FLAG and ACT2_FLAG and the internal active commands INT_ACT1 and INT_ACT2, which are generated in response to the first and second active commands ACT1 and ACT2, do not need to be shifted. Therefore, the activation of banks may be sequentially controlled by the bank control signals BKACT1 and BKACT2, which are generated in response to the first and second internal active commands ACT1 and ACT2.

Figure 3:
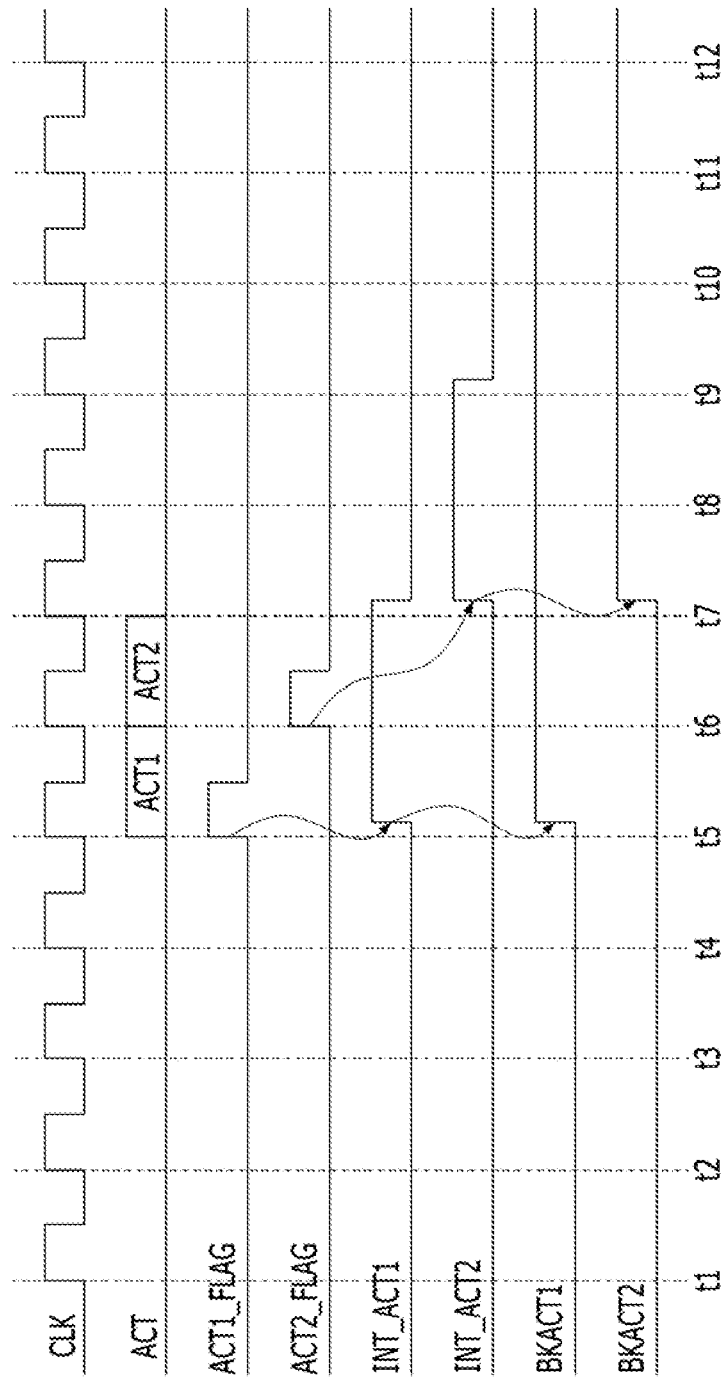
FIG. 3 is a timing diagram illustrating a case in which the active command of FIG. 1 is inputted at an interval shorter than the RAS to RAS delay tRRD.

FIG. 3 is a timing diagram illustrating a case in which the active command of FIG. 1 is inputted at an interval shorter than the RAS to RAS delay tRRD.

Referring to FIGS. 1 and 3, the first active command ACT1 generated through the command decoder 110 is inputted at the timing t5, and then the second active command ACT2 is inputted in 1tCK at a timing t6, even though the RAS to RAS delay tRRD is set to 2tCK.

As the first and second active commands ACT1 and ACT2 are inputted, the first and second flag signals ACT1_FLAG and $ACT^2$_FLAG may be sequentially activated. Then, the detection unit 140 may detect that the second active command ACT2 is inputted at an interval shorter than the RAS to RAS delay tRRD, and the shifting unit 150 may shift the second active command ACT2 by considering the RAS to RAS delay tRRD contained in the asynchronous parameter information PARA_INFO, and generate the second internal active command INT_ACT2.

Thus, although the first and second active commands ACT1 and ACT2 are not inputted based on the RAS to RAS delay tRRD, for example, they are inputted at an interval shorter than the RAS to RAS delay tRRD, the first and second internal active commands INT_ACT1 and INT_ACT2 may be generated based on the RAS to RAS delay tRRD through an internal operation. Thus, since the bank control signals BKACT1 and BKACT2 are also generated based on the RAS to RAS delay tRRD, banks may be controlled at proper timings.

Figure 4:
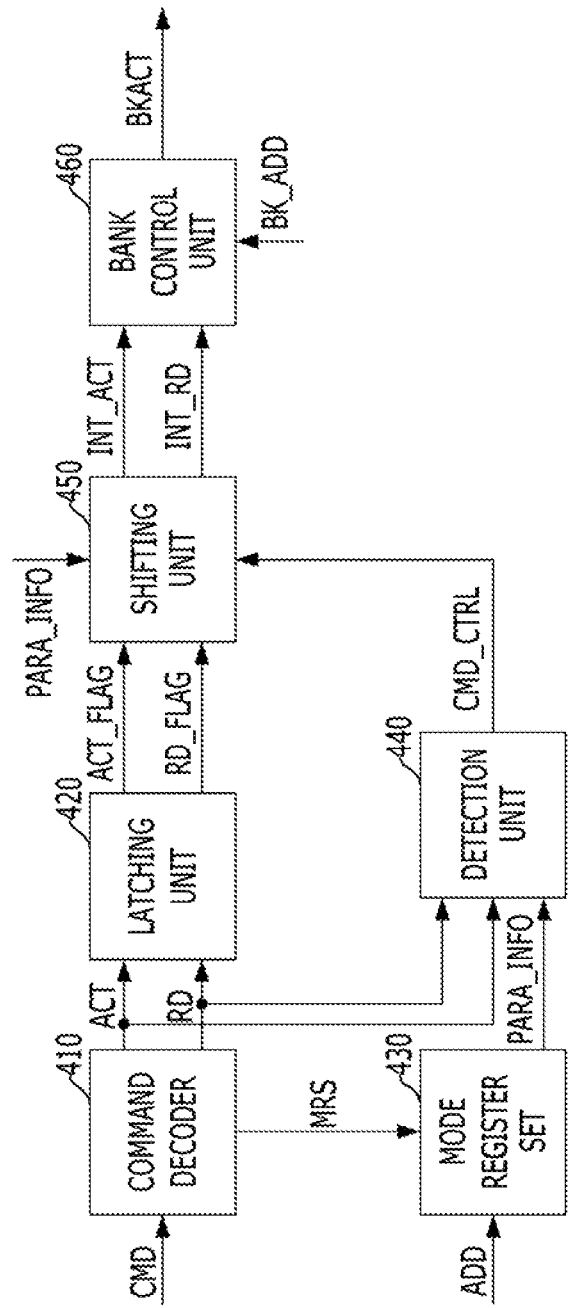
FIG. 4 is a block diagram illustrating a semiconductor memory in accordance with another embodiment of the present invention.

FIG. 4 is a block diagram illustrating a semiconductor memory in accordance with another embodiment of the present invention.

Referring to FIG. 4, the semiconductor memory may include a command decoder 410, a latching unit 420, a mode register set 430, a detection unit 440, a shifting unit 450, and a bank control unit 460.

The command decoder 410, the latching unit 420, the mode register set 430, and the bank control unit 460 may correspond to the command decoder 110, the latching unit 120, the mode register set 130, and the bank control unit 160 of FIG. 1. Thus, detailed descriptions thereof will be omitted.

FIG. 1 illustrates an embodiment based on successive active commands ACT. FIG. 4 illustrates an embodiment based on an active command ACT and a read command RD. Thus, when the read command RD is not inputted based on the RAS to CAS delay tRCD, for example, they are inputted at an interval shorter than the RAS to CAS delay tRCD, an internal command may be generated based on the RAS to CAS delay tRCD through an internal operation. Thus, a bank active operation and a read operation may be controlled based on the RAS to CAS delay tRCD.

The detection unit 440 may detect that the read command RD is inputted at an interval shorter than the RAS to CAS delay tRCD from the input of the active command ACT, and generate a control signal CMD_CTRL for shifting flag signals ACT_FLAG and RD_FLAG. Then, the shifting unit 450 may generate internal commands INT_ACT and INT_RD by shifting the flag signals ACT_FLAG and RD_FLAG based on information on the RAS to CAS delay tRCD, in response to the control signal CMD_CTRL. The information on the RAS to CAS delay tRCD may be included in asynchronous parameter information PARA_INFO received from the mode register set 430. Thus, the internal commands INT_ACT and INT_RD may control the bank active operation and the read operation based on the RAS to CAS delay tRCD.

FIG. 4 illustrates the embodiment based on the bank active operation and the read operation. The read operation is an example of a column operation. However, column operations other than the read operation may be controlled.

Figure 5:
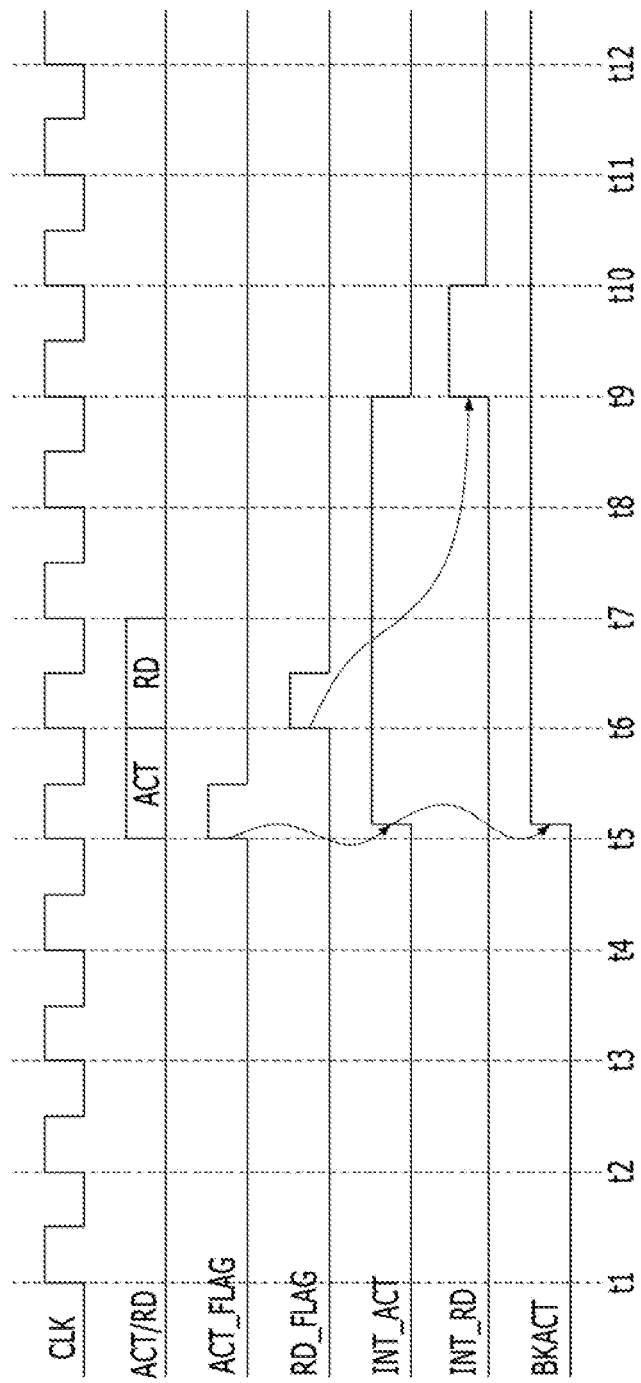
FIG. 5 is a timing diagram illustrating a case in which the read command of FIG. 4 is inputted at an interval shorter than a RAS to CAS delay tRCD.

FIG. 5 is a timing diagram illustrating a case in which the read command of FIG. 4 is inputted at an interval shorter than the RAS to CAS delay tRCD.

Referring to FIGS. 4 and 5, the active command ACT generated through the command decoder 410 is inputted at a timing t5, and then a read command RD may be inputted in 1tCK at a timing t6, even though the RAS to CAS delay tRCD is set to 4tCK.

As the active command ACT and the read command RD are inputted, an active flag signal ACT_FLAG and a read flag signal RD_FLAG may be sequentially activated by the latching unit 420. Then, the detection unit 440 may detect the read command RD inputted at an interval shorter than the RAS to CAS delay tRCD, and the shifting unit 450 may shift the read command RD based on the asynchronous parameter information PARA_INFO including the RAS to CAS delay tRCD and generate an internal read command INT_RD.

Thus, although the active command ACT and the read command RD are not inputted based on the RAS to CAS delay tRCD, for example, they are inputted at an interval shorter than the RAS to CAS delay tRCD, the internal active command INT_ACT and the internal read command INT_RD may be generated based on the RAS to CAS delay tRCD through the internal operation. Thus, a bank may perform active and read operations at proper timings based on the RAS to CAS delay tRCD.

When the read command RD is inputted regardless of the RAS to CAS delay tRCD after the active command ACT is inputted, the semiconductor memory in accordance with the embodiment of the present invention may generate the internal active command INT_ACT and the internal read command INT_RD by considering the RAS to CAS delay tRCD, through an internal operation and control a bank active operation and a read operation at proper timings.

When command collision is caused by asynchronous parameters such as the RAS to RAS delay tRRD or the RAS to CAS delay tRCD, the semiconductor memory may not perform a command operation at a proper timing. In this case, the semiconductor memory may internally control the timing such that the command operation is performed at the proper timing. Thus, the timing may be efficiently controlled.

In accordance with the embodiment of the present invention, the interval between the commands inputted to the command decoder may be determined based on an interval between the internal commands generated from the shifting unit in response to the commands.

Referring to FIG. 2, the interval between the first and second active commands ACT1 and ACT2 is 2tCK. Then, the interval between the first and second internal active commands INT_ACT1 and INT_ACT2 generated in response to the first and second active commands ACT1 and ACT2 is also 2tCK. The first and second active commands ACT1 and ACT2 are commands for the same operation, Thus, since internal operation times are equal to each other, the input interval between the first and second active commands ACT1 and ACT2 may be equal to the generation interval between the first and second internal active commands INT_ACT1 and INT_ACT2. However, when different commands are successively inputted, times required until the respective internal commands are generated may differ from each other. In this case, the input interval between the first and second commands and the generation interval between the first and second internal commands may be applied with different values. That is, the input interval between the first and second commands may be set based on the first and second internal commands.

Figure 6:
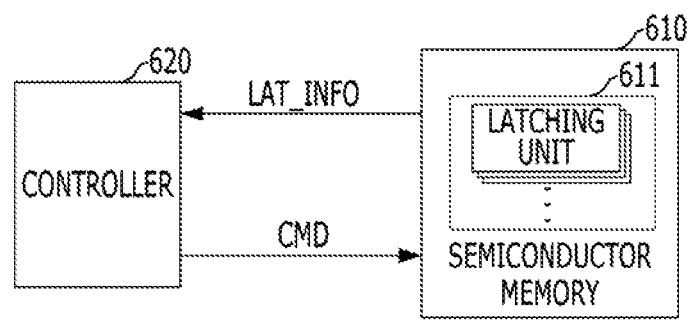
FIG. 6 is a block diagram illustrating a memory system in accordance with an embodiment of the present invention.

FIG. 6 is a block diagram illustrating a memory system in accordance with an embodiment of the present invention.

Referring to FIG. 6, the memory system may include a semiconductor memory 610 and a controller 620.

The semiconductor memory 610 may include a plurality of latching units 611 for latching a command CMD, and output number information LAT_INFO on the latching units 611.

The controller 620 may adjust the number of commands CMD which are inputted to the semiconductor memory 610 during a predetermined command input interval, in response to the number information LAT_INFO on the latching units 611, which is inputted from the semiconductor memory 610.

The predetermined command input interval may include an asynchronous parameter such as the RAS to RAS delay tRRD or the RAS to CAS delay tRCD. That is, the number of commands CMD which may be successively inputted during the RAS to RAS delay tRRD or the RAS to CAS delay tRCD may be set on the basis of the number of latching units 611 included in the semiconductor memory 610. Although the commands CMD are successively inputted during the RAS to RAS delay tRRD or the RAS to CAS delay tRCD, internal operations may be performed at proper timings because the latching units 611 hold the commands CMD.

Although not illustrated in FIG. 6 the semiconductor memory 610 may include the configuration of the semiconductor memory of FIG. 1 or 4.

In accordance with the embodiments of the present invention, although commands are inputted at an interval shorter than the internal operation interval, the internal operation may be performed at proper timing through a shifting operation for the commands. Thus, the operation timing may be efficiently secured.

Although various embodiments have been described for illustrative purposes, it will be apparent to those skilled in the art that various changes and modifications may be made without departing from the spirit and scope of the invention as defined in the following claims.

What is claimed is:

1. A memory system comprising:
   a semiconductor memory including a plurality of latching units for receiving and latching a command, and suitable for outputting information regarding number of the latching units; and
   a controller suitable for receiving the information regarding the number of the latching units from the semiconductor memory, and adjusting number of commands inputted to the semiconductor memory during a predetermined command input interval, in response to the information regarding the number of the latching units.

2. The memory system of claim 1, wherein the semiconductor memory comprises:
   a storage unit suitable for storing a minimum operation interval between command operations performed in response to the commands;
   a detection unit suitable for detecting whether the commands are activated at the minimum operation interval;
   a latching unit suitable for generating flag signals by latching the commands; and
   a shifting unit suitable for shifting the flag signals based on the minimum operation interval in response to an output signal of the detection unit, and generating internal commands.

3. The memory system of claim 2, wherein the row command signals comprise active command signals.

4. The memory system of claim 3, wherein the minimum operation interval indicates an interval between an operation of activating a bank and another operation of activating another bank, in response to the active command signals inputted successively.

5. The memory system of claim 4, further comprising:
   a bank control unit suitable for controlling the row command operations of the banks in response to the internal row command signals.

6. The memory system of claim 1, wherein the semiconductor memory comprises:
   a storage unit suitable for storing a minimum operation interval between a row command operation and a column command operation corresponding to the row command operation;
   a detection unit suitable for detecting whether a row command signal inputted for the row command operation and a column command signal inputted for the column command operation are activated at the minimum operation interval;
   a latching unit suitable for generating flag signals by latching the row command signal and the column command signal; and
   a shifting unit suitable for shifting the flag signals based on the minimum operation interval in response to an output signal of the detection unit, and generating internal command signals.

7. The semiconductor memory of claim 6, wherein the row command signal is an active command signal, and the column command signal is a read or write command signal.

8. The semiconductor memory of claim 7, wherein the minimum operation interval indicates an interval between an operation of activating a bank in response to the active command and another operation of reading or writing data from or in an activated bank in response to the read or write command signal.

9. The semiconductor memory of claim 8, further comprising:
   a bank control unit suitable for controlling the row command operation and the column command operation of the bank in response to the internal command signals.

* * * * *